(12) United States Patent
Sung

(10) Patent No.: US 8,993,391 B2
(45) Date of Patent: Mar. 31, 2015

(54) SEMICONDUCTOR DEVICE WITH RECESS GATE AND METHOD FOR FABRICATING THE SAME

(71) Applicant: SK Hynix Inc., Gyeonggi-do (KR)

(72) Inventor: Min-Chul Sung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/844,900

(22) Filed: Mar. 16, 2013

(65) Prior Publication Data

US 2014/0187031 A1    Jul. 3, 2014

(30) Foreign Application Priority Data

Dec. 27, 2012  (KR) .................. 10-2012-0154940

(51) Int. Cl.
  *H01L 21/336*  (2006.01)
  *H01L 21/8234*  (2006.01)
  *H01L 21/8238*  (2006.01)
  *H01L 21/28*  (2006.01)
  *H01L 29/49*  (2006.01)
  *H01L 29/66*  (2006.01)
  *H01L 21/308*  (2006.01)
  *H01L 29/423*  (2006.01)

(52) U.S. Cl.
  CPC .. *H01L 21/82385* (2013.01); *H01L 21/823828* (2013.01); *H01L 21/28061* (2013.01); *H01L 29/4941* (2013.01); *H01L 29/66621* (2013.01); *H01L 21/3081* (2013.01); *H01L 29/4236* (2013.01)

USPC ............ 438/199; 438/259; 438/270; 438/275

(58) Field of Classification Search
  USPC ........................ 438/197, 199, 259, 270, 275; 257/E21.655
  See application file for complete search history.

(56) References Cited

U.S. PATENT DOCUMENTS

| | | | |
|---|---|---|---|
| 6,780,694 B2 | 8/2004 | Doris et al. | |
| 2002/0090780 A1 | 7/2002 | Divakaruni et al. | |
| 2007/0096204 A1* | 5/2007 | Shiratake | ....................... 257/330 |
| 2010/0127322 A1 | 5/2010 | Mizokuchi et al. | |
| 2011/0183507 A1 | 7/2011 | Figura et al. | |

FOREIGN PATENT DOCUMENTS

| | | |
|---|---|---|
| KR | 1020060029375 | 4/2006 |
| KR | 1020090025816 | 3/2009 |
| KR | 1020090096996 | 9/2009 |
| KR | 1020100089364 | 8/2010 |
| KR | 101017051 | 2/2011 |

* cited by examiner

*Primary Examiner* — Thanhha Pham
(74) *Attorney, Agent, or Firm* — IP & T Group LLP

(57) ABSTRACT

A method for fabricating a semiconductor device includes forming a conductive layer over first and second regions of a semiconductor substrate, forming a trench extended in the first region of the semiconductor substrate through the conductive layer, forming a recessed gate electrode in the trench, doping the conductive layer and the recessed first gate electrode, and forming a second gate electrode by etching the doped conductive layer.

18 Claims, 16 Drawing Sheets

SEMICONDUCTOR DEVICE WITH RECESS GATE AND METHOD FOR FABRICATING THE SAME

CROSS-REFERENCE TO RELATED APPLICATIONS

The present application claims priority of Korean Patent Application No. 10-2012-0154940, filed on Dec. 27, 2012, which is incorporated herein by reference in its entirety.

BACKGROUND

1. Field

Exemplary embodiments of the present invention relate to a semiconductor device and a method for fabricating the same, and more particularly, to a semiconductor device with a recess gate and a method for fabricating the same.

2. Description of the Related Art

With high integration of semiconductor devices, the gate length of a transistor has continuously decreased. Accordingly, drain induced barrier lowering (DIBL), threshold voltage (Vt) roll-off or the like occurs due to a short channel effect.

Therefore, a method for increasing a channel length by applying a recess gate to a cell transistor has been recently adopted. Furthermore, an important circuit such as a sense amplifier, in which the characteristic of a transistor determines the device characteristic, in a peripheral circuit region employs a recess gate, like a cell transistor.

FIG. 1A is a cross-sectional view of a conventional semiconductor device with a recess gate.

Referring to FIG. 1A, an isolation region 12 is formed in a substrate 11, and a trench 13 is formed in an active region of the substrate 11. A gate dielectric layer 14 is formed on the surface of the trench 13. A silicon-containing electrode 15 is formed over the gate dielectric layer 14 so as to gap-fill the trench 13. The top surface of the silicon-containing electrode 15 has a higher level than the top surface of the substrate 11. A metal-containing electrode 16 is formed over the silicon-containing electrode 15. A gate hard mask layer 17 is formed over the metal-containing electrode 16. Accordingly, a recess gate structure including the silicon-containing electrode 15, the metal-containing electrode 16, and the gate hard mask layer 17 is formed. Source/drain regions 18 (not illustrated) are formed in the substrate 11 at both sides of the recess gate structure. Accordingly, a recess channel of which the channel length is increased by the silicon-containing electrode 15 is formed.

In FIG. 1A, the silicon-containing electrode 15 includes polysilicon, and is doped with a dopant to have conductivity. For example, undoped polysilicon is deposited to gap-fill the trench 13, and a dopant is then implanted. The dopant may include an N-type dopant or P-type dopant depending on the type of the transistor.

FIG. 1B is a diagram illustrating a conventional impurity doping method for a silicon-containing electrode.

Referring to FIG. 1B, when an implant method is used to implant a dopant, 'Rp' may be set at a deep position of the trench 13 as indicated by reference numeral ①.

In the conventional impurity doping method, however, regions where Rp is set at a relatively shallow position and source/drain regions are to be formed may be damaged as indicated by reference numerals ② and ③.

Furthermore, when a planar gate structure and a recess gate structure are formed at the same time, it may be difficult to implement a dopant implant process that satisfies both of the planar gate structure and the recess gate structure.

SUMMARY

Various exemplary embodiments of the present invention are directed to a semiconductor device and a method for fabricating the same, which may implant a dopant into a silicon-containing electrode without damaging areas where source/drain regions are to be formed.

Also, various exemplary embodiments of the present invention are directed to a semiconductor device and a method for fabricating the same, which may dope silicon-containing electrodes of a planar gate structure and a recess gate structure at the same time.

In an exemplary embodiment of the present invention, a method for fabricating a semiconductor device includes forming a conductive layer over first and second regions of a semiconductor substrate; forming a trench extended in the first region of the semiconductor substrate through the conductive layer; forming a recessed first gate electrode in the trench; doping the conductive layer and the recessed first gate electrode; and forming a second gate electrode by etching the doped conductive layer. The conductive layer and the recessed first gate electrode may include polysilicon.

In another exemplary embodiment of the present invention, a method for fabricating a semiconductor device includes forming a conductive layer over first, second and third regions of a semiconductor substrate; forming first and second trenches extended in the first and second regions of the semiconductor substrate, respectively, through the conductive layer; forming recessed first and second gate electrodes in the first and second trenches respectively; doping a first dopant into the conductive layer and the recessed first gate electrode; doping a second dopant into the recessed second gate electrode; performing anneal to activate the first and second dopants; and forming a third gate electrode over the third region by etching the doped conductive layer. The forming of the recessed first and second gate electrodes may include forming a polysilicon layer over the conductive layer so as to gap-fill the first and second trenches; and etching back the polysilicon layer such that the polysilicon layer is left to a level corresponding to the interface between the conductive layer and the semiconductor substrate.

In still another exemplary embodiment of the present invention, a method for fabricating a semiconductor device includes forming a conductive layer over first and second regions of a semiconductor substrate; forming a trench extended in the first region of the semiconductor substrate through the conductive layer; forming a gate dielectric layer on the surface of the trench; forming a recessed first gate electrode over the gate dielectric layer; recessing the gate dielectric layer to a lower level than that of the surface of the recessed first gate electrode; doping the conductive layer and the recessed first gate electrode; forming a metal-containing layer including a barrier layer to cap the recessed first gate electrode; forming metal-containing electrodes over the recessed first gate electrode and the conductive layer, respectively, by etching the metal-containing layer and forming a second gate electrode over the second region by etching the doped conductive layer.

In still another exemplary embodiment of the present invention, a method for fabricating a semiconductor device includes forming a conductive layer over first, second and third regions of a semiconductor substrate; forming a trench extended in the first region of the semiconductor substrate through the conductive layer; forming a recessed first gate electrode in the trench; doping the conductive layer and the recessed first gate electrode with a dopant; selectively removing the doped conductive layer in the third region; forming a metal-containing layer on the entire surface of the resulting structure including the remaining doped conductive layer; forming metal-containing electrodes in the first and second regions and forming a bit line in the third region, by etching the metal-containing layer; and forming a second gate electrode over the second region by etching the doped conductive layer.

In still another exemplary embodiment of the present invention, a method for fabricating a semiconductor device includes forming a conductive layer over first, second and third regions of a semiconductor substrate; forming a trench extended in the first region of the semiconductor substrate through the conductive layer; forming a gate dielectric layer on the surface of the trench; forming a recessed first gate electrode over the gate dielectric layer; recessing the gate dielectric layer to a lower level than that of the surface of the first gate electrode; doping the conductive layer and the recessed first gate electrode with a dopant; selectively removing the doped conductive layer in the third region; forming a metal-containing layer including a barrier layer to cap the recessed first gate electrode and the recessed gate dielectric layer; forming metal-containing electrodes in the first and second regions and forming a bit line in the third region, by etching the metal-containing layer; and forming a second gate electrode over the second region by etching the doped conductive layer.

In still another exemplary embodiment of the present invention, a semiconductor device includes a semiconductor substrate comprising first, second and third regions; a trench formed in the first region of the semiconductor substrate; a recessed first gate electrode formed in the trench; a gate dielectric layer formed between the recessed first gate electrode and the surface of the trench and recessed to a lower level than that of the top surface of the recessed first gate electrode; a first barrier layer capping the top surfaces of the recessed first gate electrode and the gate dielectric layer; a first metal-containing electrode formed over the first barrier layer; a second gate electrode formed over the second region of the semiconductor substrate; and a bit line formed over the third region of the semiconductor substrate.

DETAILED DESCRIPTION

Figure 1A:
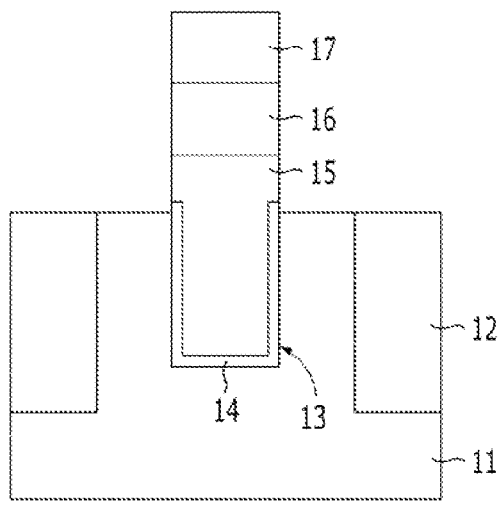
FIG. 1A is a cross-sectional view of a conventional semiconductor device with a recess gate.
Figure 1B:
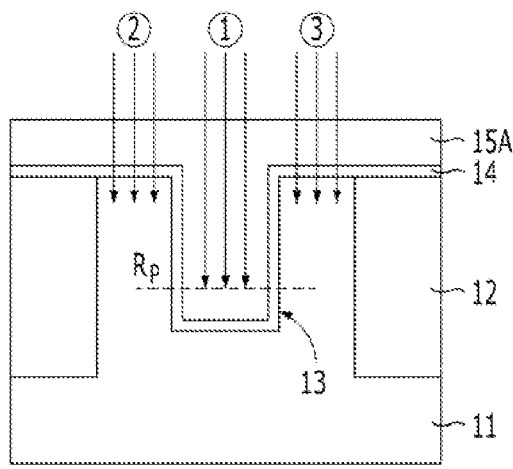
FIG. 1B is a diagram illustrating a conventional impurity doping method for a silicon-containing electrode.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
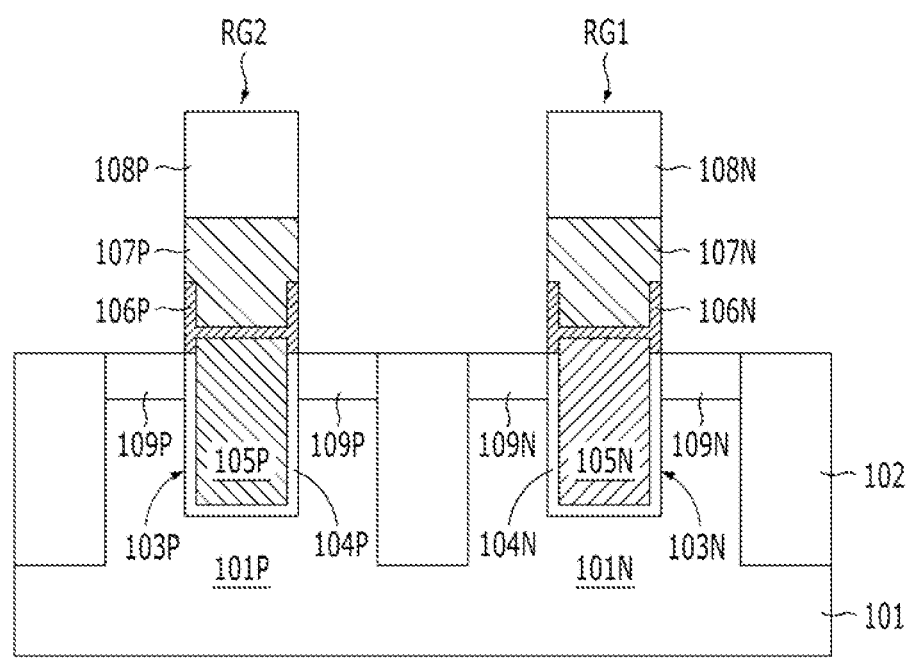
FIG. 2 is a cross-sectional view illustrating a portion of a semiconductor device in accordance with a first embodiment of the present invention.

FIG. 2 is a cross-sectional view illustrating a portion of a semiconductor device in accordance with a first embodiment of the present invention.

Referring to FIG. 2, a substrate 101 may include a first region 101N and a second region 101P. The first and second regions 101N and 101P may be isolated by an isolation region 102. The first and second regions 101N and 101P may include an NMOSFET region and a PMOSFET region. For example, the first region 101N may include an NMOSFET region, and the second region 101P may include a PMOSFET region. The first and second regions 101N and 101P may be formed in a peripheral circuit region.

Each of the first and second regions 101N and 101P may include a recess gate structure formed therein. The first region 101N includes a first recess gate structure RG1 formed therein, and the second region 101P includes a second recess gate structure RG2 formed therein. The first recess gate structure RG1 has a stacked structure including a recessed first doped gate electrode 105N in the first trench 103N. The second recess gate structure RG2 has a stacked structure including a recessed second doped gate electrode 105P in the second trench 103P.

First, the first recess gate structure RG1 may include a first doped gate electrode 105N, a first barrier layer 106N, a first metal-containing electrode 107N, and a first gate hard mask layer 108N. The first doped gate electrode 105N may be doped with an N-type dopant. The first doped gate electrode 105N may include doped polysilicon, for example, N-type doped polysilicon.

The second recess gate structure RG2 may include a second doped gate electrode 105P, a second barrier layer 106P, a second metal-containing electrode 107P, and a second gate hard mask layer 108P. The second doped gate electrode 105P may be doped with a P-type dopant. The second doped gate electrode 105P may include doped polysilicon, for example, P-type doped polysilicon.

The first and second barrier layers 106N and 106P may be formed of the same material. The first and second barrier layers 106N and 106P may include a titanium-containing material. For example, the first and second barrier layers 106N and 106P may include titanium nitride. The first barrier layer 106N may cap the first gate dielectric layer 104N and the first doped gate electrode 105N. The second barrier layer 106P may cap the second gate dielectric layer 104P and the second doped electrode 105P.

The first and second metal-containing electrodes 107N and 107P may be formed of the same material. The first and second metal-containing electrodes 107N and 107P may include a tungsten-containing material. For example, the first and second metal-containing electrodes 107N and 107P may include tungsten or tungsten silicide.

The first and second gate hard mask layers 108N and 108P may be formed of the same material. The first and second gate hard mask layers 108N and 108P may include nitride for example, silicon nitride.

The first and second doped gate electrodes 105N and 105P may be recessed and formed in the first and second trenches 103N and 103P, respectively. Furthermore, the first and second gate dielectric layers 104N and 104P may be formed on the surfaces of the first and second trenches 103N and 103P, respectively. The first and second gate dielectric layers 104N and 104P may include silicon oxide, silicon nitride, or high-k dielectric. The high-k dielectric may include a material containing a metal such as hafnium or zirconium. The high-k dielectric may include metal oxide, metal silicide, or metal silicate nitride. The first and second gate dielectric layers 104N and 104P may be recessed to lower levels than those of the top surfaces of the first and second doped gate electrodes 105N and 105P, respectively.

First source/drain regions 109N may be formed in the substrate 101 at both sides of the first recess gate structure RG1. Second source/drain regions 109P may be formed in the substrate 101 at both sides of the second recess gate structure RG2. The first source/drain regions 109N may be doped with an N-type dopant, and the second source/drain regions 109P may be doped with a P-type dopant.

The first recess gate structure RG1 may become a gate structure of NMOSFET. The second recess gate structure RG2 may become a gate structure of PMOSFET.

FIGS. 3A to 3K are diagrams illustrating a method for fabricating the semiconductor device in accordance with the first embodiment of the present invention.

Figure 3A:
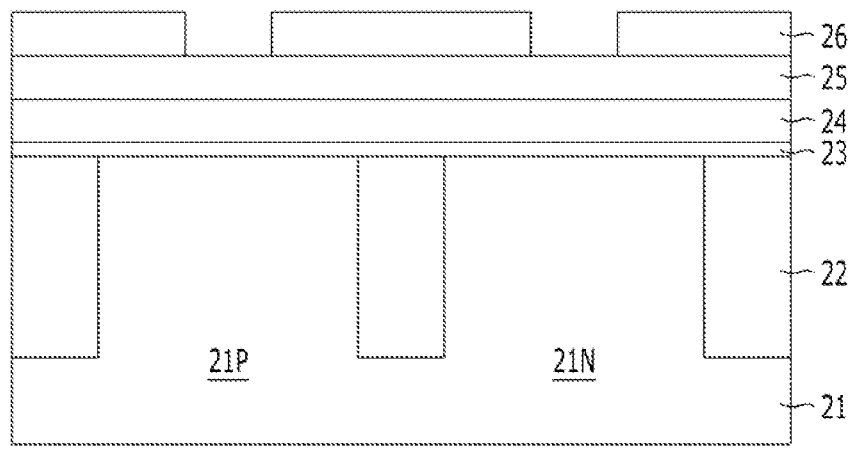
FIGS. 3A to 3K are diagrams illustrating a method for fabricating the semiconductor device in accordance with the first embodiment of the present invention.

Referring to FIG. 3A, a substrate 21 is prepared. The substrate 21 may include a plurality of regions in which a transistor is to be formed. The plurality of regions may include a first region 21N and a second region 21P. The first and second regions 21N and 21P may include a transistor region formed in a peripheral circuit region. The first and second regions 21N and 21P may include an NMOSFET region and a PMOSFET region. In this embodiment, the first region 21N may include an NMOSFET region, and the second region may include a PMOSFET region. The first and second regions 21N and 21P are divided for convenience of description, and the positions thereof may be changed. The substrate 21 may include a semiconductor material. The substrate 21 may include a semiconductor substrate. The substrate 21 may include a silicon substrate, for example, a single crystal silicon substrate.

An isolation region 22 is formed in the substrate 21. The isolation region 22 may be formed through a shallow trench isolation (STI) process. For example, a pad layer (not illustrated) is formed over the substrate 21, and an isolation mask (not illustrated) is used to etch the pad layer and the substrate 21. Accordingly, a trench is formed. After the trench is formed, the trench is gap-filled with an insulator to form the isolation region 22. The isolation region 22 may include wall oxide, liner, and spin on dielectric (SOD), which are sequentially formed therein. The liner may be formed by stacking a silicon nitride layer and a silicon oxide layer. The silicon nitride layer may include $Si_3N_4$, and the silicon oxide layer may include $SiO_2$. The SOD may include polysilazane-based silicon oxide.

A sacrifice layer 23 is formed over the substrate 21. The sacrifice layer 23 may include oxide. The sacrifice layer 23 may include silicon oxide.

A conductive layer 24 is formed over the sacrifice layer 23, and a hard mask layer 25 is formed over the conductive layer 24. The hard mask layer 25 may include a material having an etch selectivity when the substrate is etched. The hard mask layer 25 may include oxide, nitride, amorphous carbon or the like. The hard mask layer 25 may be formed by stacking a plurality of materials. The conductive layer 24 is a material to become a gate electrode, and may serve as a hard mask layer. The conductive layer 24 may include a silicon-containing material. The conductive layer 24 may include polysilicon. The polysilicon may include doped polysilicon. When the conductive layer 24 includes polysilicon, the hard mask layer 25 may include silicon oxide.

Then, a first mask pattern 26 is formed over the hard mask layer 25. The first mask pattern 26 may be formed of photoresist. The first mask pattern 26 is a mask pattern defining a trench that is to be formed in the substrate 21.

Figure 3B:
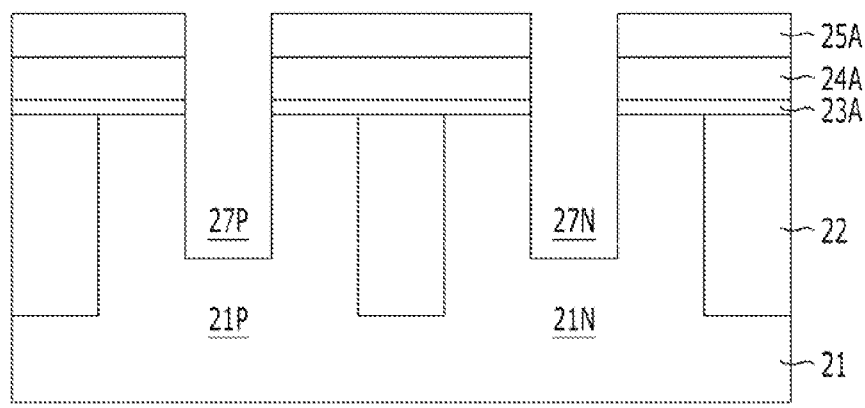

Referring to FIG. 3B, the first mask pattern 26 is used as an etch mask to etch the hard mask layer 25 and the conductive layer 24. Accordingly, a hard mask pattern 25A and a conductive layer pattern 24A are formed. The conductive layer pattern 24A exposes a predetermined surface of the substrate 21. The exposed surface of the substrate 21 is where a trench is to be formed.

Subsequently, the first mask pattern 26 is removed, and the hard mask pattern 25A is used as an etch mask to etch the substrate 21. Accordingly, first and second trenches 27N and 27P are formed to a predetermined depth. The first trench 27N may be formed in the first region 21N, and the second trench 27P may be formed in the second region 21P. The first and second trenches 27N and 27P have a space in which a gate material is to be buried. During a subsequent process, a recess channel may be formed by recessing and forming a gate material in the first and second trenches 27N and 27P. When the substrate 21 is etched, the sacrifice layer 23 may also be etched. Therefore, a sacrifice layer pattern may be left as indicated by reference numeral 23A.

Figure 3C:
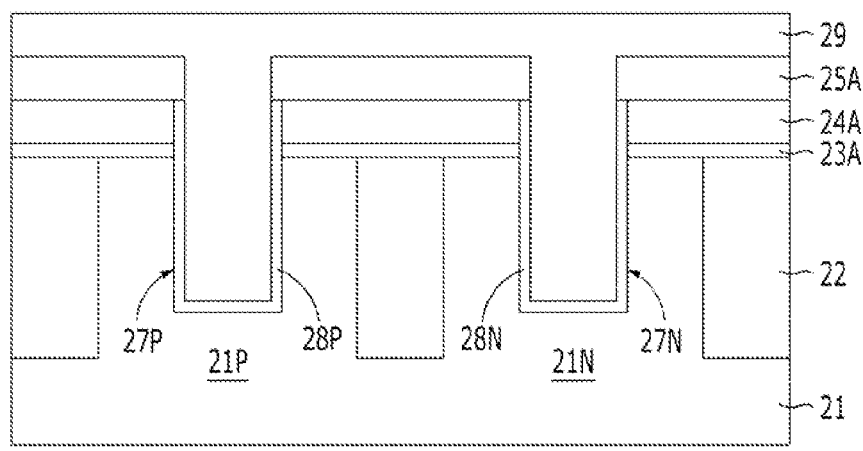

Referring to FIG. 3C, first and second gate dielectric layers 28N and 28P are formed. The first gate dielectric layer 28N may be formed in the first trench 27N. The second gate dielectric layer 28P may be formed in the second trench 27P. The first and second gate dielectric layers 28N and 28P may be formed through an oxidation process or deposition process. When the oxidation process is used, the bottom and sidewall surfaces of the first and second trenches 27N and 27P may be thermally oxidized to form the first and second gate dielectric layers 28N and 28P. The first and second gate dielectric layers 28N and 28P may include oxide or high-k dielectric. The first and second gate dielectric layers 28N and 28P may be simultaneously formed in the first and second regions 21N and 21P, respectively. When the first and second gate dielectric layers 28N and 28P are formed through the oxidation process, oxidation may also be performed on the sidewalls of the conductive layer pattern 24A.

Then, a gate conductive layer 29 is formed on the entire surface of the resultant structure including the first and second gate dielectric layers 28N and 28P. The gate conductive layer 29 is formed along the entire surface of the substrate 21 so as to gap-fill the first and second trenches 27N and 27P over the first and second gate dielectric layers 28N and 28P. Therefore, the gate conductive layer 29 is formed to have a thickness to sufficiently gap-fill the first and second trenches 27N and 27P, and also has a predetermined thickness over the hard mask pattern 25A. The gate conductive layer 29 may include a silicon-containing layer. The gate conductive layer 29 may include undoped polysilicon.

Figure 3D:
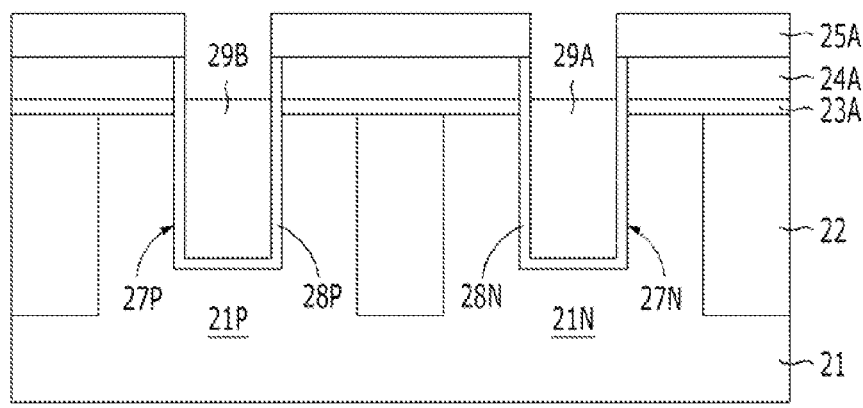

Referring to FIG. 3D, the gate conductive layer 29 is selectively removed. For this operation, an etch-back process may be applied. As the gate conductive layer 29 is etched back, recessed first and second gate electrodes 29A and 29B are formed in the first and second trenches 27N and 27P, respectively. The top surfaces of the first and second gate electrodes 29A and 29B may have the same levels as that of the surface of the sacrifice layer pattern 23A. More specifically, the first and second gate electrodes 29A and 29B may be recessed to be left at a level corresponding to the interface between the substrate 21 and the conductive layer 24A. The first gate electrode 29A may be recessed and formed in the first trench 27N over the first gate dielectric layer 28N. The second gate electrode 29B may be recessed and formed in the second trench 28P over the second gate dielectric layer 28P.

Figure 3E:
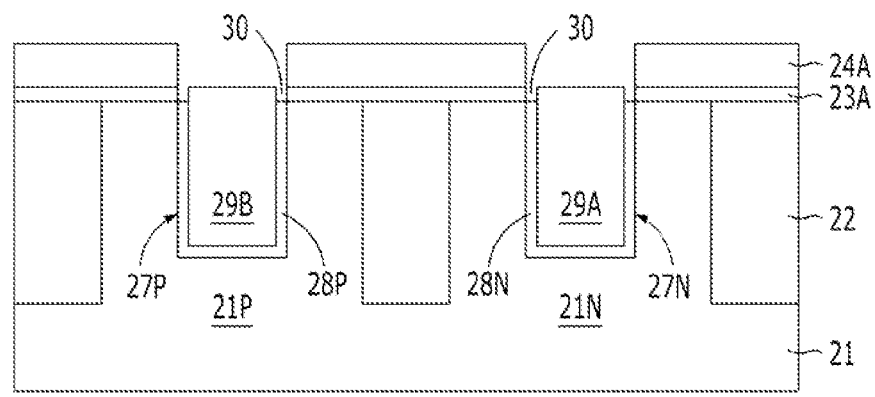

Referring to FIG. 3E, the hard mask pattern 25A is removed. At this time, the hard mask pattern 25A may be removed by wet etching. When the hard mask layer pattern 25A is removed, the first and second gate dielectric layers 28N and 28P may be recessed. In this case, the first and second gate dielectric layers 28N and 28P may be recessed to expose the upper sidewalls of the first and second gate electrodes 29A and 29B. Accordingly, grooves 30 may be formed.

Figure 3F:
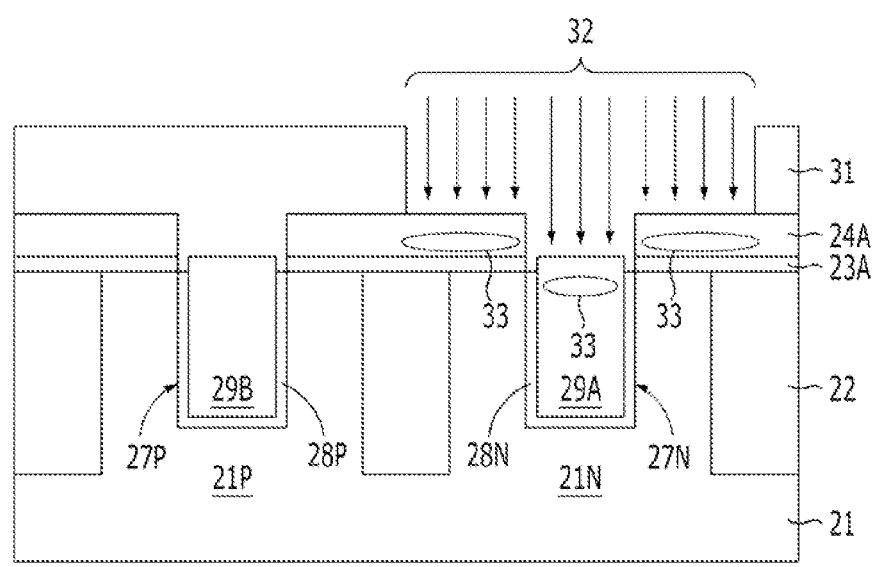

Referring to FIG. 3F, a second mask pattern 31 is formed over the conductive layer pattern 24A. The second pattern 31 may have a shape to open any one of the first and second regions 21N and 21P. In this embodiment of the present invention, the second mask pattern 31 may cover the second region 21P and open the first region 21N. Accordingly, the first gate electrode 29A and the conductive layer pattern 24A of the first region 21N may be exposed by the second mask pattern 31.

Then, the first gate electrode 29A and the conductive layer pattern 24A are doped. For example, a first dopant 32 is doped. Therefore, the first gate electrode 29A and the conductive layer pattern 24A are doped with the first dopant 32. As the first dopant 32 is doped, a first doped region 33 may be formed in the first gate electrode 29A and the conductive layer pattern 24A.

When the first dopant 32 is implanted, the conductive layer pattern 24A may serve as a buffer layer. Therefore, the surface of the substrate 21 under the conductive layer pattern 24A may be prevented from being influenced by the doping of the first dopant 32. The first dopant 32 may be doped by implant or plasma doping. The first dopant 32 may include an N-type dopant or P-type dopant. In this embodiment, the first dopant 32 may include an N-type dopant. The N-type dopant may include arsenic or phosphorous.

Figure 3G:
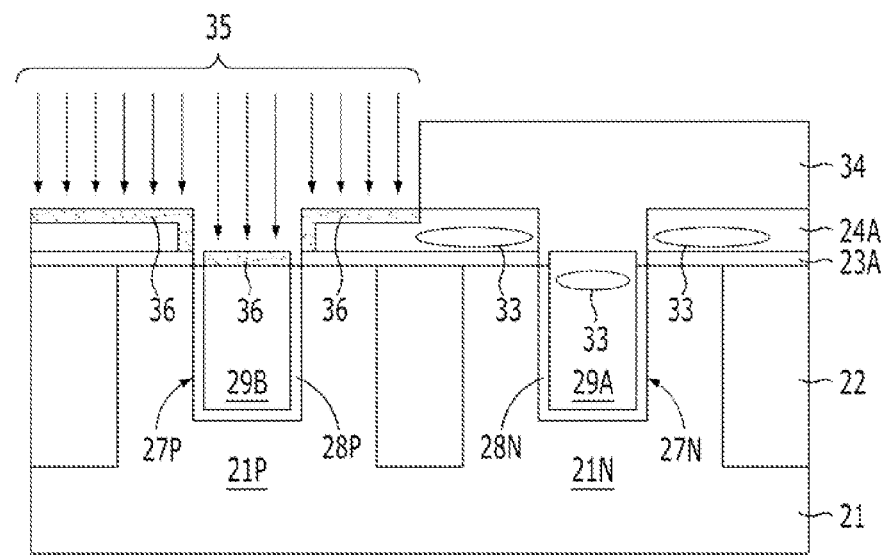

Referring to FIG. 3G, the second mask pattern 31 is removed.

A third mask pattern 34 is formed over the conductive layer pattern 24A. The third mask pattern 34 may have a shape to open any one of the first and second regions 21N and 21P. In this embodiment of the present invention, the third mask pattern 34 may cover the first region 21N and open the second region 21P. Accordingly, the second gate electrode 29B and the conductive layer pattern 24A of the second region 21P may be exposed by the third mask pattern 34.

Then, the second gate electrode 29B is doped. For this operation, a second dopant 35 may be doped. Therefore, the second gate electrode 29B and the conductive layer pattern 24A exposed by the third mask pattern 34 are doped with the second dopant 35. As the second dopant 35 is doped, a second doped region 36 may be formed in the second gate electrode 29B and the conductive layer pattern 24A. When the second dopant 35 is implanted, the conductive layer pattern 24A may serve as a buffer layer. Therefore, the surface of the substrate 21 under the conductive layer pattern 24A, that is, areas where source/drain regions are to be formed may be prevented from being influenced. The second dopant 35 may be doped by implant or plasma doping. The second dopant 35 may include an N-type dopant or P-type dopant. In this embodiment of the present invention, the second dopant 35 includes a P-type dopant. The P-type dopant may include boron.

Through the above-described doping processes of the first and second dopants 32 and 35, the first and second gate electrodes 29A and 29B may be doped with different conductive types of dopants. Furthermore, when the first and second dopants 32 and 35 are doped, the first and second dopants 32 and 35 may be sufficiently doped to deep regions of the recessed first and second gate electrodes 29A and 29B, even though an ion implant target is set to the conductive layer pattern 24A.

Figure 3H:
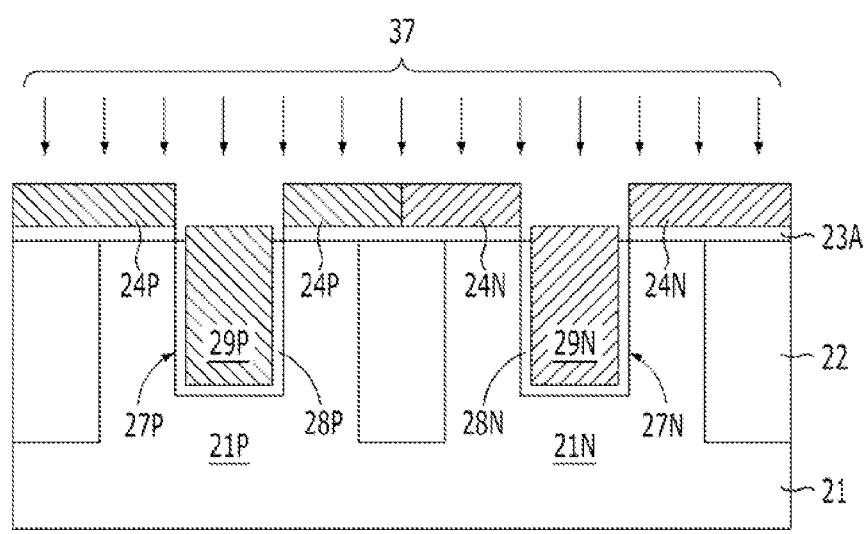

Referring to FIG. 3H, the third mask pattern 34 is removed.

Anneal 37 is performed. The anneal 37 may include rapid thermal anneal. Through the anneal 37, the first and second dopants doped in the first and second doped regions 33 and 36 are activated. Therefore, a first doped gate electrode 29N is formed in the first region 21N, and a second doped gate electrode 29P is formed in the second region 21P. In other words, the first and second doped gate electrodes 29N and 29P are formed by activating the first and second dopants doped in the first and second gate electrodes 29A and 29B, respectively, through the anneal 37. Meanwhile, the first and second dopants doped in the conductive layer pattern 24A may be activated through the anneal 37. Therefore, the conductive layer pattern 24A may be converted into first and second doped conductive layer patterns 24N and 24P. In this embodiment of the present invention, the first doped gate electrode 29N and the first doped conductive layer pattern 24N may be uniformly doped with the N-type dopant. Also, the second doped gate electrode 29P and the second doped conductive layer pattern 24P may be uniformly doped with the P-type dopant.

Figure 3I:
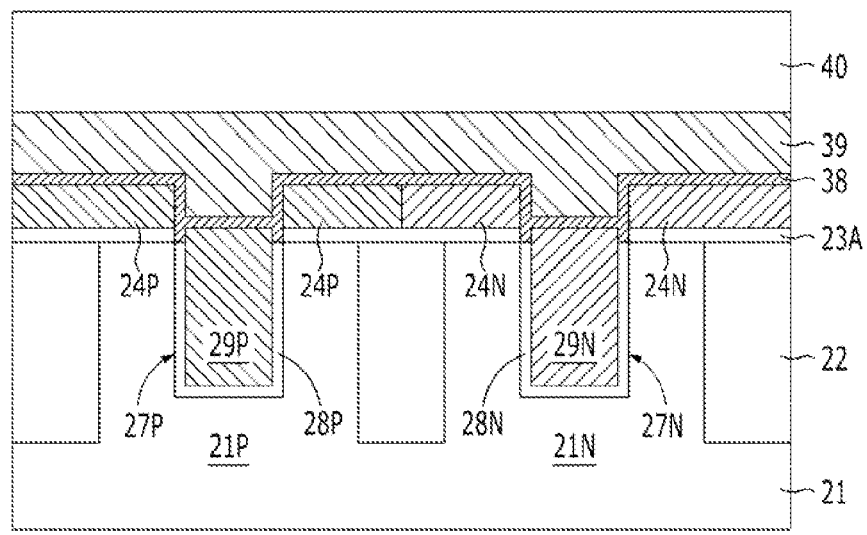

Referring to FIG. 3I, a metal-containing layer is formed on the entire surface of the resultant structure including the first and second doped gate electrodes 29N and 29P. The metal-containing layer may include a barrier layer 38 and a metal layer 39, which are sequentially formed. A gate hard mask layer 40 is formed over the metal layer 39. The metal-containing layer may include metal. The metal-containing layer serves to reduce gate resistance. The metal-containing layer may include a metallic material based on titanium or tungsten. The metal-containing layer may be selected from the group consisting of titanium, titanium nitride, tungsten nitride, and tungsten. The barrier layer 38 may serve to prevent diffusion between the metal layer 39 and the first and second doped gate electrodes 29N and 29P. The barrier layer 38 may include titanium nitride, titanium silicon nitride, tungsten nitride, tungsten silicide, tungsten silicon nitride or the like.

The barrier layer 38 may be conformally formed while filling the groove 30. Accordingly, the barrier layer 38 may cap the top surfaces and upper sidewalls of the recessed first and second doped gate electrodes 29N and 29P.

The gate hard mask layer 40 may include silicon nitride.

Figure 3J:
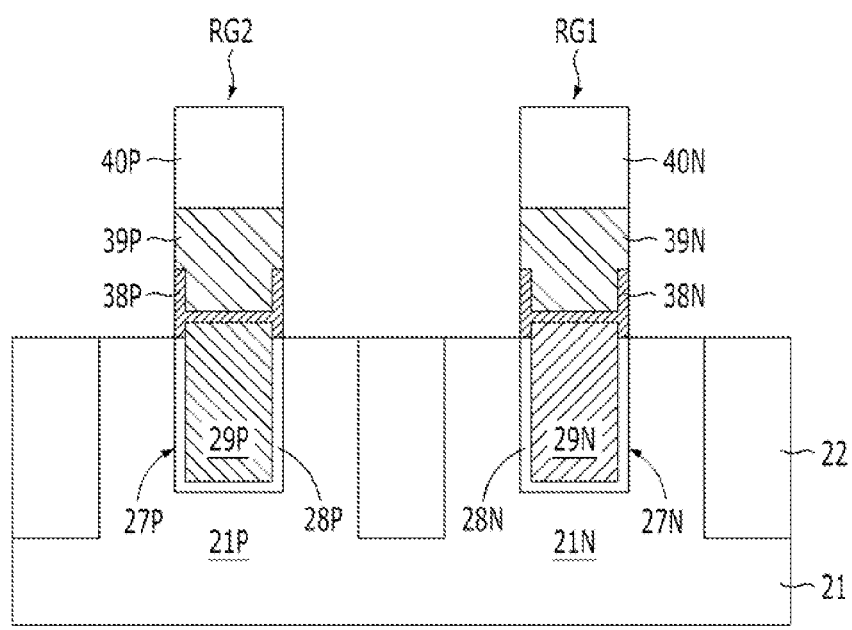

Referring to FIG. 3J, metal-containing electrodes are formed in the first and second regions 21N and 21P, respectively. A first metal-containing electrode 39N is formed in the first region 21N, and a second metal-containing electrode 39P is formed in the second region 21P. In order to form the first and second metal-containing electrodes 39N and 39P, a gate mask pattern (not illustrated) may be used as an etch mask. For example, the gate hard mask layer 40, the metal layer 39, and the barrier layer 38 are sequentially etched. After the barrier layer 38 is etched, both of the first and second doped conductive layer patterns 24N and 24P may be removed.

A first recess gate structure RG1 is formed in the first region 21N, and a second recess gate structure RG2 is formed in the second region 21P. The first recess gate structure RG1 has a stacked structure including the recessed first doped gate electrode 29N in the first trench. The second recess gate structure RG2 has a stacked structure including the recessed second doped gate electrode 29P in the second trench.

The first recess gate structure RG1 may include the first doped gate electrode 29N, the first barrier layer 38N, the first metal-containing layer 39N, and the first gate hard mask layer 40N. The second recess gate structure RG2 may include the second doped gate electrode 29P, the second barrier layer 38P, the second metal containing layer 39P, and the second gate hard mask layer 40P. The first and second barrier layers 38N and 38P are formed of the same material. The first and second metal-containing electrodes 39N and 39P are formed of the same material. The first and second gate hard mask layers 40N and 40P are formed of the same material. The first and second gate dielectric layers 28N and 28P may be formed on the surfaces of the first and second trenches 27N and 27P, respectively. The first and second gate dielectric layers 28N and 28P may be recessed to lower levels than those of the top surfaces of the first and second doped gate electrodes 29N and 29P. The first barrier layer 38N may cap the first doped gate electrode 29N and the first gate dielectric layer 28N. The second barrier layer 38P may cap the second doped gate electrode 29P and the second gate dielectric layer 28P. The first and second barrier layers 38N and 38P may be self-aligned with both sidewalls of the first and second trenches 27N and 27P, respectively.

Subsequently, although not illustrated, a gate spacer process may be performed. The gate spacer may include silicon oxide, silicon nitride or the like.

Figure 3K:
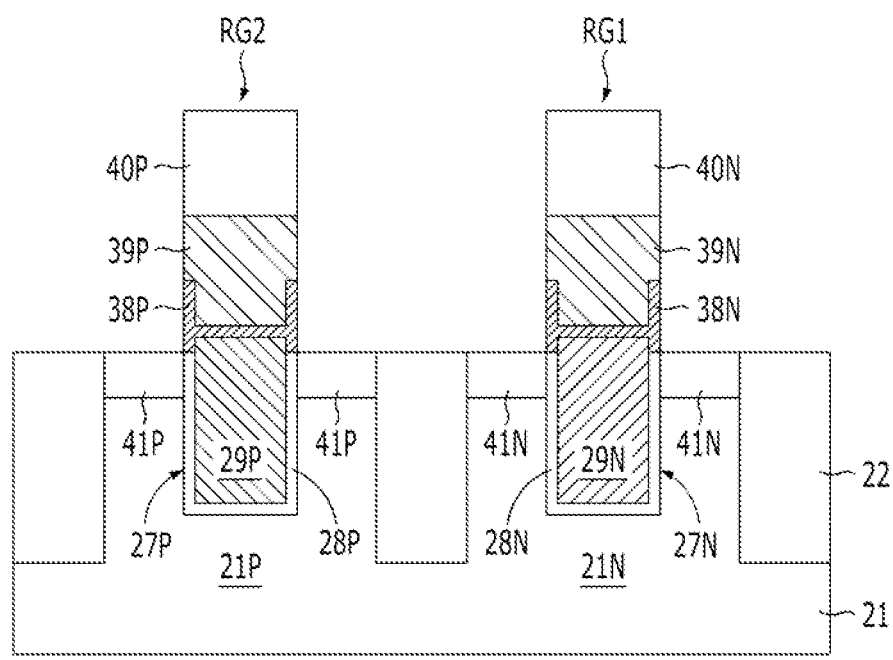

Referring to FIG. 3K, first source/drain regions 41N and second source/drain regions 41P are formed. For this operation, first and second source/drain ion implant processes (not illustrated) may be performed. Then, anneal is performed. The anneal may include rapid thermal anneal. The anneal is performed to activate dopants implanted in the first and second source/drain regions 41N and 41P. In this embodiment of the present invention, the first source/drain regions 41N may be doped with an N-type dopant, and the second source/drain regions 41P may be doped with a P-type dopant.

The above-described semiconductor device may become a CMOS device. The above-described method may be applied to a method for fabricating a semiconductor device in which an N-channel transistor and a P-channel transistor are formed. Furthermore, the method may also be applied to a method for fabricating an N-channel transistor and a method for fabricating a P-channel transistor. The P-channel transistor may include a PMOSFET, and the N-channel transistor may include an NMOSFET.

Figure 4:
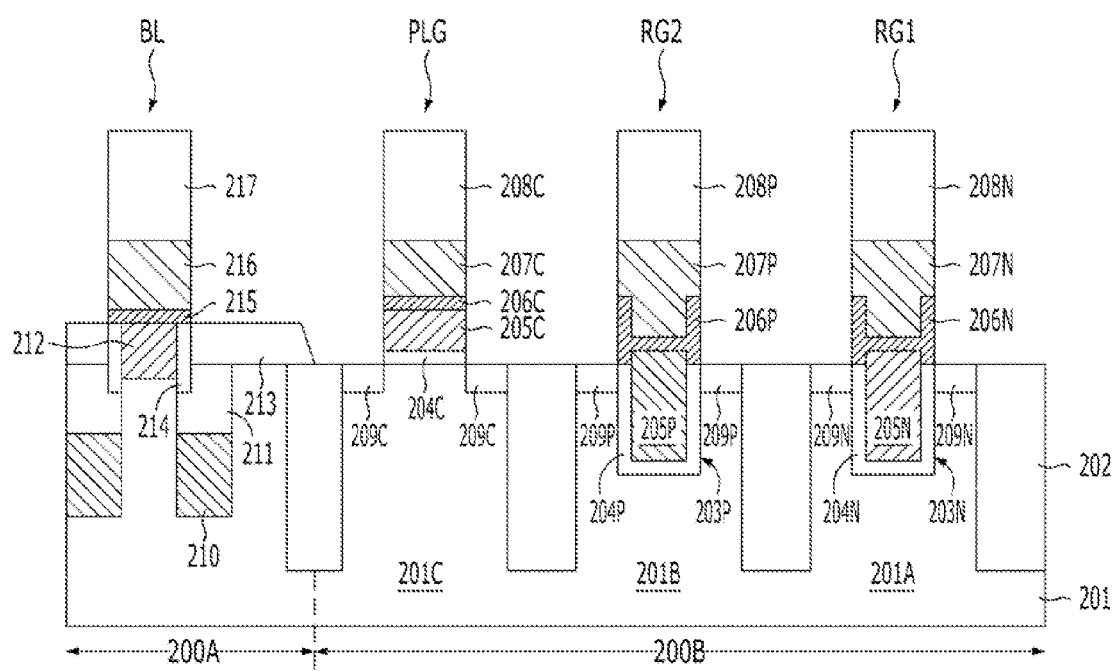
FIG. 4 is a cross-sectional view illustrating a portion of a semiconductor device in accordance with a second embodiment of the present invention.

FIG. 4 is a cross-sectional view illustrating a portion of a semiconductor device in accordance with a second embodiment of the present invention.

Referring to FIG. 4, a substrate 201 may include a cell region 200A and a peripheral circuit region 200B. The peripheral circuit region 200B may include a first region 201A, a second region 201B, and a third region 201C. The cell region 200A and the peripheral circuit region 200B may be isolated by an isolation region 202. The first region 201A, the second region 201B, and the third region 201C may be isolated by the isolation region 202. The first and third regions 201A and 201C may include an NMOSFET region, and the second region 202B may include a PMOSFET region.

Recess gate structures may be formed in the first and second regions 201A and 201B respectively. A planar gate structure PLG may be formed in the third region 201C. A first recess gate structure RG1 is formed in first region 201A, and a second recess gate structure RG2 is formed in the second region 201B. The first recess gate structure RG1 has a stacked structure including a recessed first doped gate electrode 205N in a first trench 203N. The second recess gate structure RG2 has a stacked structure including a recessed second doped gate electrode 205P in a second trench 203P. The planar gate structure PLG may include a third doped gate electrode 205C.

First, the first recess gate structure RG1 may include the first doped gate electrode 205N, a first barrier layer 206N, a first metal-containing electrode 207N and a first gate hard mask layer 208N. The first doped gate electrode 205N may be doped with an N-type dopant. The first doped gate electrode 205N may include doped polysilicon, for example, N-type doped polysilicon.

The second recess gate structure RG2 may include the second doped gate electrode 205P, a second barrier layer 206P, a second metal-containing electrode 207P, and a second gate hard mask layer in 208P. The second doped gate electrode 205P may be doped with a P-type dopant. The second doped gate electrode 205P may include doped polysilicon, for example, P-type doped polysilicon. The first and second doped gate electrodes 205N and 205P may be recessed and formed in the first and second trenches 203N and 203P, respectively.

First and second gate dielectric layers 204N and 204P may be formed on the surfaces of the first and second trenches 203N and 203P, respectively. The first and second gate dielectric layers 204N and 204P may include silicon oxide, silicon nitride, or high-k dielectric. The high-k dielectric may include a material containing a metal such as hafnium or zirconium. The first and second gate dielectric layers 204N and 204P may include metal oxide, metal silicate, or metal silicate nitride. The first and second gate dielectric layers 204N and 204P may be recessed to lower levels than those of the top surfaces of the first and second doped gate electrodes 205N and 205P, respectively.

The planar gate structure PLG formed in the third region 201C may include a third doped gate electrode 205C, a third barrier layer 206C, a third metal-containing electrode 207C, and a third gate hard mask layer 208C, which are stacked therein. The third doped gate electrode 205C may be doped with an N-type dopant or P-type dopant.

The first barrier layer 206N, the second barrier layer 206P, and the third barrier layer 206C may be formed of the same material. The first barrier layer 206N, the second barrier layer 206P, and the third barrier layer 206C may include a titanium-containing material, for example, titanium nitride. The first barrier layer 206N may cap the first gate dielectric layer 204N and the first doped gate electrode 205N. The second barrier layer 206P may cap the second gate dielectric layer 204P and the second doped gate electrode 205P. The third barrier layer 206C may be formed over the third doped gate electrode 205C.

The first metal-containing electrode 207N, the second metal-containing electrode 207P, and the third metal-containing electrode 207C may be formed of the same material. The first metal-containing electrode 207N, the second metal-containing electrode 207P, and the third metal-containing electrode 207C may include a tungsten-containing material, for example, tungsten or tungsten silicide.

The first gate hard mask layer 208N, the second gate hard mask layer 208P, and the third gate hard mask layer 208C may be formed of the same material. The first gate hard mask layer 208N, the second gate hard mask layer 208P, and the third gate hard mask layer 208C may include nitride, for example, silicon nitride.

First source/drain regions 209N may be formed in the substrate 201 at both sides of the first recess gate structure RG1. Second source/drain regions 209P may be formed in the substrate 201 at both sides of the second recess gate structure RG2. Third source/drain regions 209C may be formed in the substrate 201 at both sides of the planar gate structure PLG. The first source/drain regions 209N and the third source/drain regions 209C may be doped with an N-type dopant, and the second source/drain regions 209P may be doped with a P-type dopant. The third source/drain region 209C may be doped with a P-type dopant.

The first recess gate structure RG1 and the planar gate structure PLG may become a gate structure of NMOSFET. The second recess gate structure RG2 may become a gate structure of PMOSFET. The planar gate structure PLG may become a gate structure of PMOSFET.

The cell region 200A may include a buried gate electrode 210 and a contact plug 212 formed therein. The buried gate electrode 210 may include a metal-containing layer. A capping layer 211 may be buried over the buried gate electrode 210. The contact plug 212 is formed over the substrate 201. A bit line structure BL including a bit line 216 may be formed over the contact plug 212. Between the bit line 216 and the contact plug 212, a fourth barrier layer 215 may be formed. The contact plug 212 may be formed in an interlayer dielectric layer 213 and a spacer 214 may be formed around the contact plug 212. The interlayer dielectric layer 213 may be formed, for example, only in the cell region 200A. The bit line 216 may include the same material as those of the first and second metal-containing electrodes 207N and 207P. The fourth barrier layer 215 may include the same material as those of the first to third barrier layers 206N, 206P, and 206C. Although described below, the bit line 216 may be formed at the same time when the first to third metal-containing electrodes 207N, 207P, and 207C are formed. Furthermore, the fourth barrier layer 215 may be formed at the same time when the first to third barrier layers 206N, 206P, and 206C are formed. A bit line hard mask layer 217 may be formed over the bit line 216. The bit line hard mask layer 217 may include the same material as those of the first to third gate hard mask layers 208N, 208P, and 208C. The bit line hard mask layer 217 may be formed at the same time when the first to third gate hard mask layers 208N, 208P, and 208C are formed.

In FIG. 4, the buried gate electrode 210 is formed in the cell region 200A, and the planar gate structure PLG and the first and second recess gate structures RG1 and RG2 are formed in the peripheral circuit region 200B.

FIGS. 5A to 5K are diagrams illustrating a method for fabricating the semiconductor device in accordance with the second embodiment of the present invention.

Figure 5A:
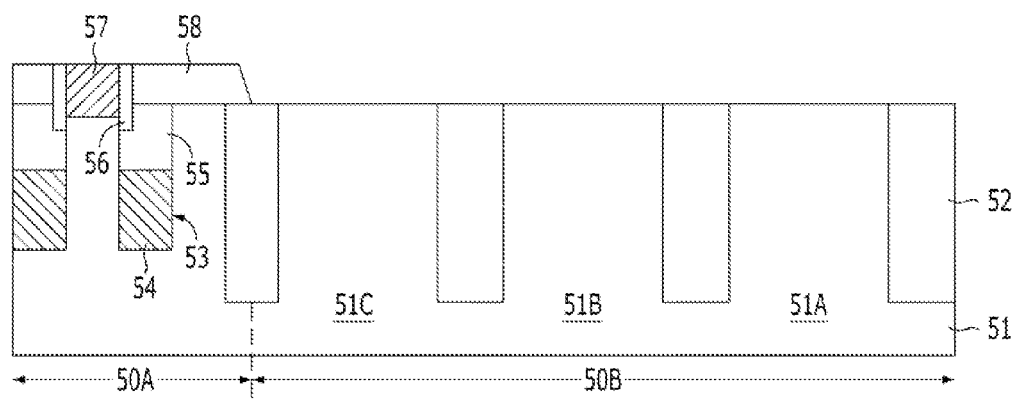
FIGS. 5A to 5K are diagrams illustrating a method for fabricating the semiconductor device in accordance with the second embodiment of the present invention.

Referring to FIG. 5A, a substrate 51 is prepared. The substrate 51 may include a cell region 50A and a peripheral circuit region 50B. The cell region 50A is where a memory cell is formed, and may include a cell transistor, a cell bit line, and a capacitor, which are formed therein. The peripheral circuit region 50B may include a plurality of regions. The plurality of regions may include a first region 51A, a second region 51B, and a third region 51C. The third region 51C may include a region where a transistor with a planar gate structure is formed. The first and second regions 51A and 51B are where a transistor with a recess gate structure is formed. The first and third regions 51A and 51C may include an NMOS-FET region, and the second region 51B may include a PMOS-FET region. In this embodiment of the present invention, the first to third regions 51A to 51C are divided for convenience of description, and the positions thereof may be changed. The substrate 51 may include a semiconductor material. The substrate 51 may include a semiconductor substrate. The substrate 51 may include a silicon substrate, for example, a single crystal silicon substrate.

An isolation region 52 is formed in the substrate 51. The isolation region 52 may be formed through an STI process. For example, a pad layer (not illustrated) is formed over the substrate 51, and an isolation mask (not illustrated) is used to etch the pad layer and the substrate 51. Accordingly, a trench is formed. After the trench is formed the trench is gap-filled with an insulator to form the isolation region 52. The isolation region 52 may include wall oxide, liner, and SOD, which are sequentially formed. The liner may be formed by stacking a silicon nitride layer and a silicon oxide layer. The silicon nitride layer may include $Si_3N_4$, and the silicon oxide layer may include $SiO_2$. The SOD may include polysilazane-based silicon oxide. The isolation region 52 may be formed to gap-fill trenches having different critical dimensions (CD) in the cell region and the peripheral circuit region, respectively. This process may be performed according to the well-known technology.

Then, a cell transistor may be formed in the cell region 50A. The cell transistor may include a buried gate electrode 54. The buried gate electrode 54 may be buried in a gate trench 5, a capping layer 55 may be buried over the buried gate electrode 54. The buried gate electrode 54 may include a metal-containing layer such as tungsten. The capping layer 55 may include nitride such as silicon nitride.

Subsequently, an interlayer dielectric layer 58 is formed on the entire surface of the substrate 51. The interlayer dielectric layer 58 is etched to form a contact hole. A spacer 56 is formed on both sidewalls of the contact hole. A contact plug 57 is buried in the contact hole. The contact plug 57 may include a bit line contact plug.

Then, the interlayer dielectric layer 58 is selectively removed to expose the peripheral circuit region 50B.

Figure 5B:
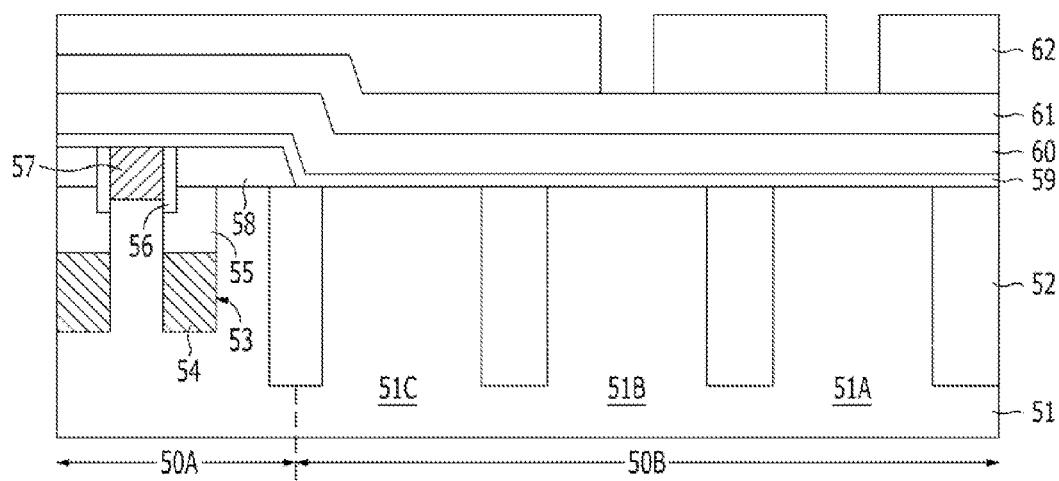

Referring to FIG. 5B, a gate dielectric layer 59 is formed on the entire surface of the substrate 51. The gate dielectric layer 59 may include oxide. The gate dielectric layer 59 may include silicon oxide. The gate dielectric layer 59 may be used as a gate dielectric layer in the third region 51C, and used as a sacrifice layer in the first and second regions 51A and 51B.

A conductive layer 60 is formed over the gate dielectric layer 59, and a hard mask layer 61 is formed over the conductive layer 60. The hard mask layer 61 may include a material having an etch selectivity when the substrate 51 is etched. The hard mask layer 61 may include oxide, nitride, amorphous carbon or the like. The hard mask layer 61 may be formed by stacking a plurality of materials. The conductive layer 60 is a material to become a gate electrode, and may serve as a buffer layer. For example, the conductive layer 60 may be used as a gate electrode in the third region 51C, and used as a buffer layer in the first and second regions 51A and 51B. The conductive layer 60 may include a silicon-containing material. The conductive layer 60 may include polysilicon. The polysilicon may include undoped polysilicon. When the conductive layer 60 includes polysilicon, the hard mask layer 61 may include silicon oxide.

Then, a first mask pattern 62 is formed over the hard mask layer 61. The first mask pattern 62 may be formed of photoresist. The first mask pattern 62 is a mask pattern defining trenches to be formed in the first and second regions 51A and 51B.

Figure 5C:
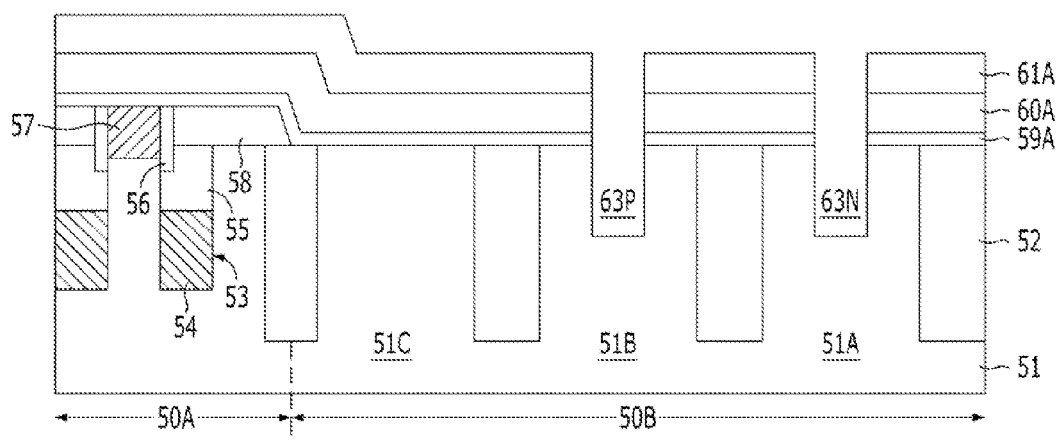

Referring to FIG. 5C, the first mask pattern 62 is used as an etch mask to etch the hard mask layer 61 and the conductive layer 60. Accordingly, a hard mask pattern 61A and a conductive layer pattern 60A are formed. The conductive layer pattern 60A exposes a predetermined surface of the substrate 51. The exposed surface of the substrate 51 is where a trench is to be formed.

Subsequently, the first mask pattern 62 is removed, and the hard mask pattern 61A is used as an etch mask to etch the substrate 51. Accordingly, first and second trenches 63N and 63P are formed to a predetermined thickness. The first trench 63N may be formed in the first region 51A, and the second trench 63P may be formed in the second region 51B. The first and second trenches 63N and 63P have a space where a gate material is to be buried. During a subsequent process, a gate material may be buried in the first and second trenches 63N and 63P so as to form a recess channel. When the substrate 51 is etched, the gate dielectric layer 59 may also be etched. Therefore, a gate dielectric layer pattern may be left as indicated by reference numeral 59A.

Figure 5D:
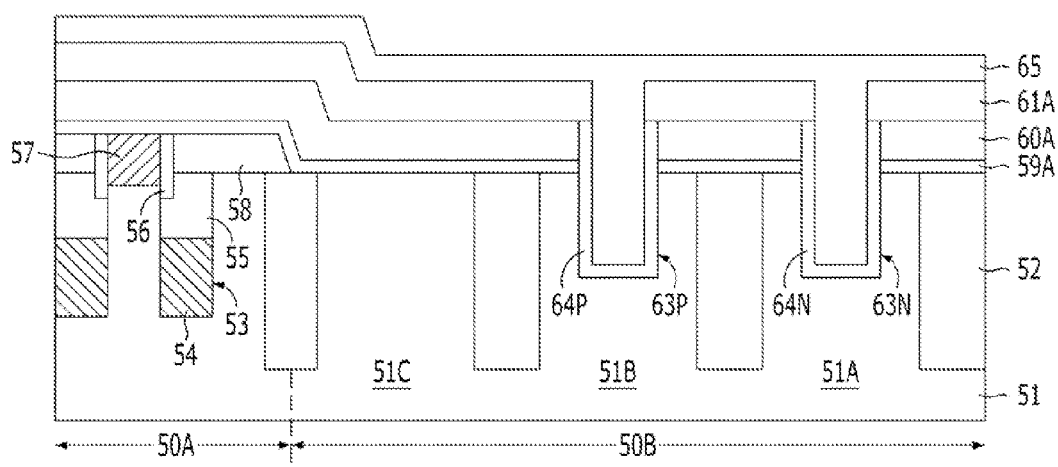

Referring to FIG. 5D, first and second gate dielectric layers 64N and 64P are formed. The first gate dielectric layer 64N may be formed in the first trench 63N, and the second gate dielectric layer 64P may be formed in the second trench 63P. The first and second gate dielectric layers 64N and 64P may be formed through oxidation process or deposition process. When the oxidation process is used, the bottom and sidewall surfaces of the first and second trenches 63N and 63P may be thermally oxidized to form the first and second gate dielectric layers 64N and 64P. The first and second dielectric layers 64N and 64P may include oxide or high-k dielectric. The first and second gate dielectric layers 64N and 64P may be simultaneously formed in the first and second regions 51A and 51B, respectively. When the first and second gate dielectric layers 64N and 64P are formed through the oxidation process, oxidation may also be performed on the sidewalls of the conductive layer pattern 60A.

Then, a gate conductive layer 65 is formed on the entire surface of the resultant structure including the first and second gate dielectric layers 64N and 64P. The gate conductive layer 65 is formed on the entire surface of the substrate 51A so as to gap-fill the first and second trenches 63N and 63P over the first and second dielectric layers 64N and 64P. Therefore, the gate conductive layer 65 is formed to have a thickness to sufficiently gap-fill the first and second trenches 64N and 64P, and also has a predetermined thickness over the hard mask pattern 61A. The gate conductive layer 65 may include a silicon-containing layer. The gate conductive layer 65 may include undoped polysilicon.

Figure 5E:
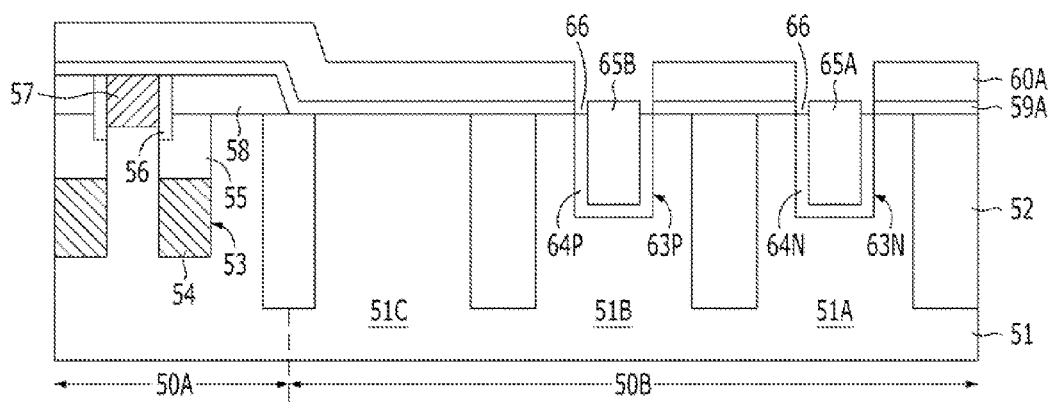

Referring to FIG. 5E, the gate conductive layer 65 is selectively removed. For this operation, an etch-back process may be applied. As the gate conductive layer 65 is etched back, first and second gate electrodes 65A and 65B are recessed and formed in the first and second trenches 63N and 63P, respectively. The top surfaces of the first and second gate electrodes 65A and 65B may have the same levels as that of the surface of the gate dielectric layer pattern 59A. The first gate electrode 65A may be recessed and formed in the first trench 63N over the first gate dielectric layer 64N. The second gate electrode 65B may be recessed and formed in the second trench 63P over the second gate dielectric layer 64P.

Then, the hard mask pattern 61A is removed. At this time, since the hard mask pattern 61A includes oxide, wet etch may be used. When the hard mask pattern 61A is removed, the first and second gate dielectric layers 64N and 64P may be recessed. Therefore, grooves 66 may be formed at the top corners of the first and second gate electrodes 65A and 65B.

Figure 5F:
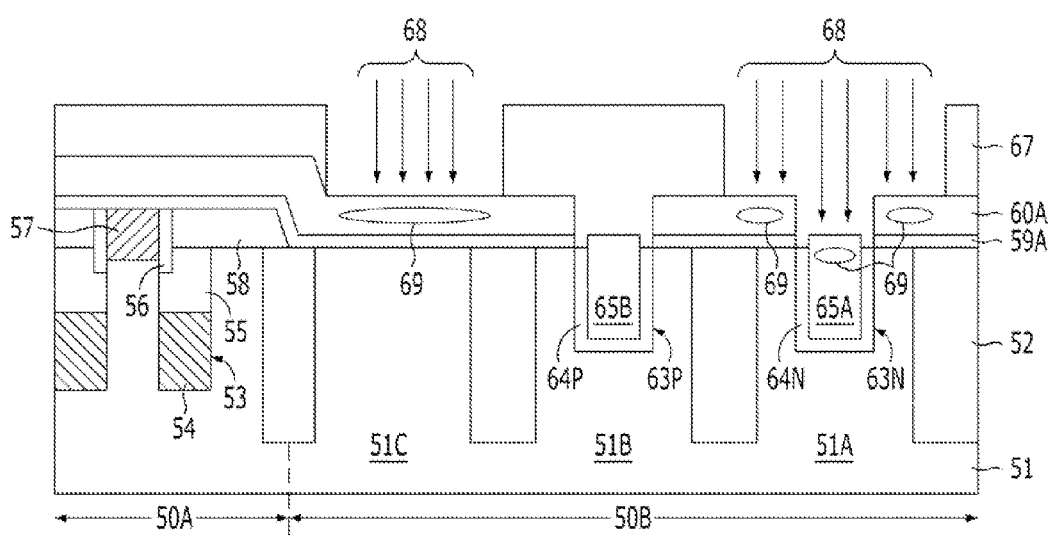

Referring to FIG. 5F, a second mask pattern 67 is formed over the conductive layer pattern 60A. The second mask pattern 67 may have a shape to open any one transistor region of the first and second regions 51A and 51B. In this embodiment of the present invention, the second mask pattern 67 may cover the second region 51B, and open the first region 51A. Accordingly, the first gate electrode 65A and the conductive layer pattern 60A of the first region 51A may be exposed by the second mask pattern 67. Meanwhile, the second mask pattern 67 may open the third region 51C, and cover the cell region 50A. Therefore, the first region 51A and the third region 51C may be exposed through the second mask pattern 67.

Then, a first dopant 68 is doped. Therefore, the first dopant 68 is doped into the first gate electrode 65A and the conductive layer pattern 60A. As the first dopant 68 is doped, a first doped region 69 is formed in the first gate electrode 65A and the conductive layer pattern 60A. When the first dopant 68 is doped, the conductive layer pattern 60A serves as a buffer layer. Therefore, the surface of the substrate 51 under the conductive layer pattern 60A may be prevented from being influenced. The first dopant 68 may be doped by implant or plasma doping. The first dopant 68 may include an N-type dopant or P-type dopant. In this embodiment of the present invention, the first dopant 68 includes an N-type dopant. The N-type dopant may include arsenic or phosphorous. As the first dopant 68 is doped into the third region 51C, the first dopant 68 is also doped into the conductive layer pattern 60A of the third region 50C. This means that the doping process for forming the gate electrode of the third region 51C is performed at the same time.

Figure 5G:
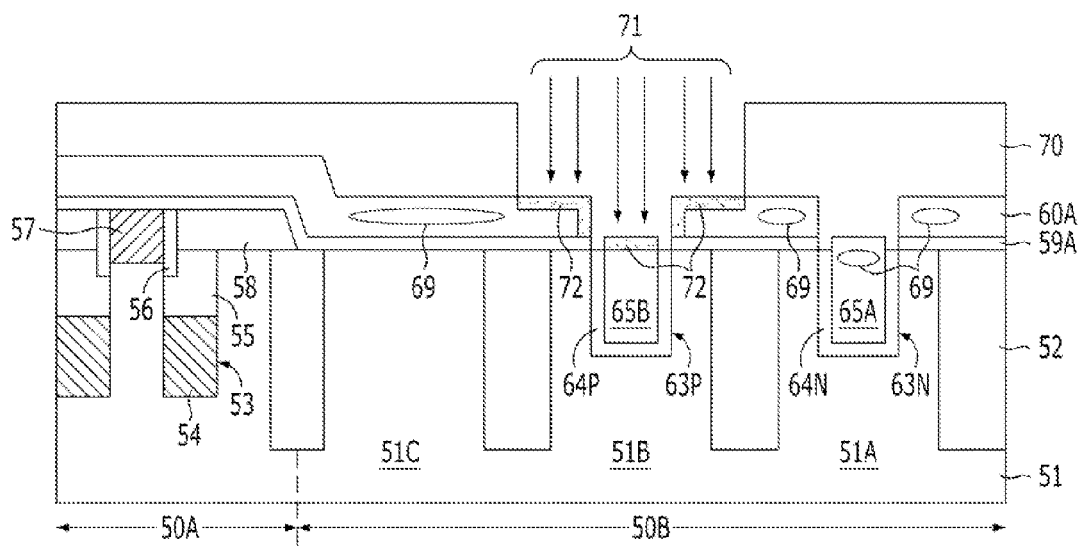

Referring to FIG. 5G, the second mask pattern 67 is removed.

A third mask pattern 70 is formed over the conductive layer pattern 60A. The third mask pattern 70 may have a shape to open any one of the first and second regions 51A and 51B. In this embodiment of the present invention, the third mask pattern 70 may cover the first region 51A and open the second region 51B. Accordingly, the second gate electrode 65B and the conductive layer pattern 60A of the second region 51B may be exposed by the third mask pattern 70. Meanwhile, the third mask pattern 70 may cover the third region 51C and the cell region 50A.

Then, a second dopant 71 is doped. Therefore, the second dopant 71 is doped into the second gate electrode 65B and the conductive layer pattern 60A. As the second dopant 71 is doped, a second doped region 72 may be formed in the second gate electrode 65B and the conductive layer pattern 60A. When the second dopant 71 is doped, the conductive layer pattern 60A serves as a buffer layer. Therefore, the surface of the substrate 51 under the conductive layer pattern 60A may be prevented from being influenced. The second dopant 71 may be doped by implant or plasma doping. The second dopant 71 may include an N-type dopant or P-type dopant. In this embodiment of the present invention, the second dopant 71 may include a P-type dopant. The P-type dopant may include boron.

Through the above-described series of doping processes for the first and second dopants 68 and 71, different conductive types of dopants are doped into the first and second gate electrodes 65A and 65B. Furthermore, when the first and second dopants 68 and 71 are doped, the first and second dopants 68 and 71 may be sufficiently doped to deep regions of the recessed first and second gate electrodes 65A and 65B, even though the ion implant target is set to the conductive layer pattern 60A to be included in a planar gate structure.

Figure 5H:
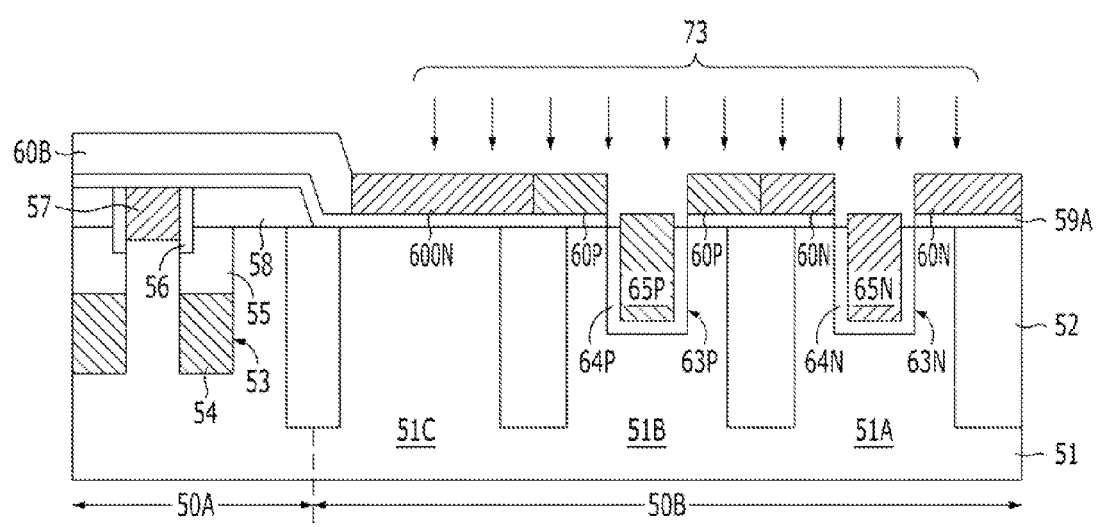

Referring to FIG. 5H, the third mask pattern 70 removed.

Anneal 73 is performed. The anneal 73 may include rapid thermal anneal. Through the anneal 73, the first and second dopants doped in the first and second doped region 69 and 72 are activated. Therefore, a first doped gate electrode 65N is formed in the first region 51A, and a second doped gate electrode 65P is formed in the second region 51B. In other words, the first and second doped gate electrodes 65N and 65P are formed by activating the first and second dopants doped in the first and second gate electrodes 65A and 65B, respectively, through the anneal 73. Meanwhile, the first and second dopants doped in the conductive layer pattern 60A may also be activated by the anneal 73. Therefore, the conductive layer pattern 60A may become doped conductive layer patterns as indicated by reference numerals 60N, 60P, and 600N.

In this embodiment of the present invention, the N-type dopant may be uniformly doped into the first doped gate electrode 65N, and the P-type dopant may be uniformly doped into the second doped gate electrode 65P. The doped conductive layer pattern 600N of the third region 51C may become a third gate electrode through a subsequent etch process.

Meanwhile, the undoped conductive layer pattern 60B may be left in the cell region 50A.

Figure 5I:
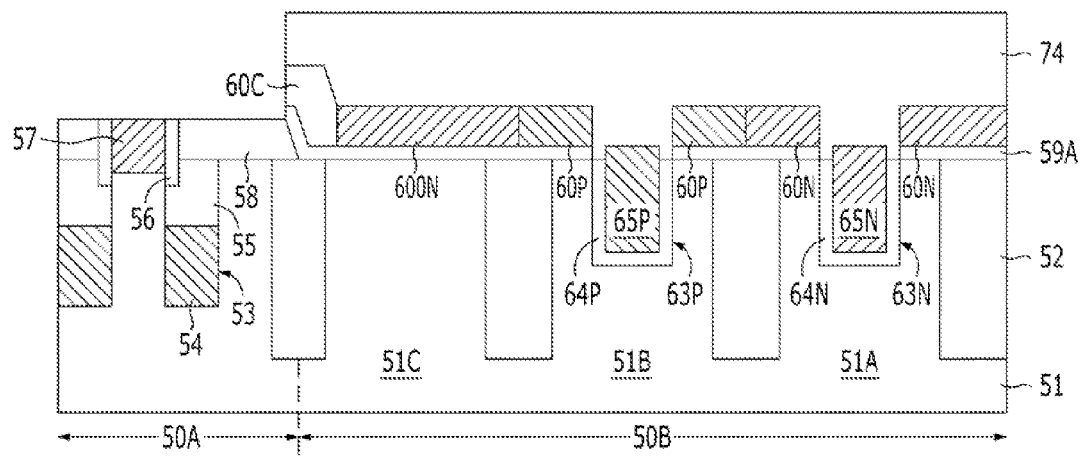

Referring to FIG. 5I, a fourth mask pattern 74 is formed on the entire surface of the substrate 51. The fourth mask pattern 74 opens the cell region 50A and covers the peripheral circuit region 50B. The fourth mask pattern 74 is used to remove the conductive layer pattern 60B left in the cell region 50A and the gate dielectric layer pattern 59A. Accordingly, the contact plug 57 may be exposed. The conductive layer pattern 60C over the peripheral circuit region 50B may be left.

Figure 5J:
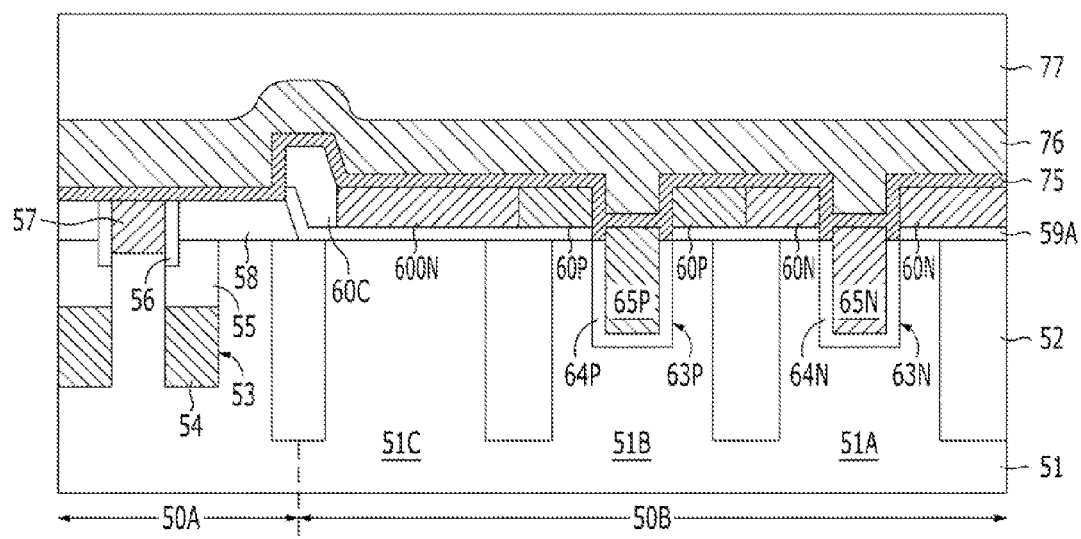

Referring to FIG. 5J, a metal-containing layer is formed on the entire surface of the resultant structure including the first and second doped gate electrodes 65N and 65P. The metal-containing layer may be formed by forming a barrier layer 75 and then forming a metal layer 76 over the barrier layer 75. A gate hard mask layer 77 is formed over the metal-containing layer. The barrier layer 75 may include metal. The metal layer 76 includes a material containing metal, and serves to reduce gate resistance. The metal layer 76 may include a metallic material based on titanium or tungsten. The metal layer 76 may be selected from the group consisting of titanium, titanium nitride, tungsten nitride, and tungsten. The barrier layer 75 may serve as an anti-diffusion layer. The barrier layer 75 may include titanium nitride, titanium silicon nitride, tungsten nitride, tungsten silicide, tungsten silicon nitride or the like.

The barrier layer 75 may be conformally formed while filling the grooves 66. In other words, the barrier layer 75 may be formed to cap the top surfaces and upper sidewalls of the first and second doped gate electrodes 65N and 65P.

The gate hard mask layer 77 may include nitride such as silicon nitride.

Figure 5K:
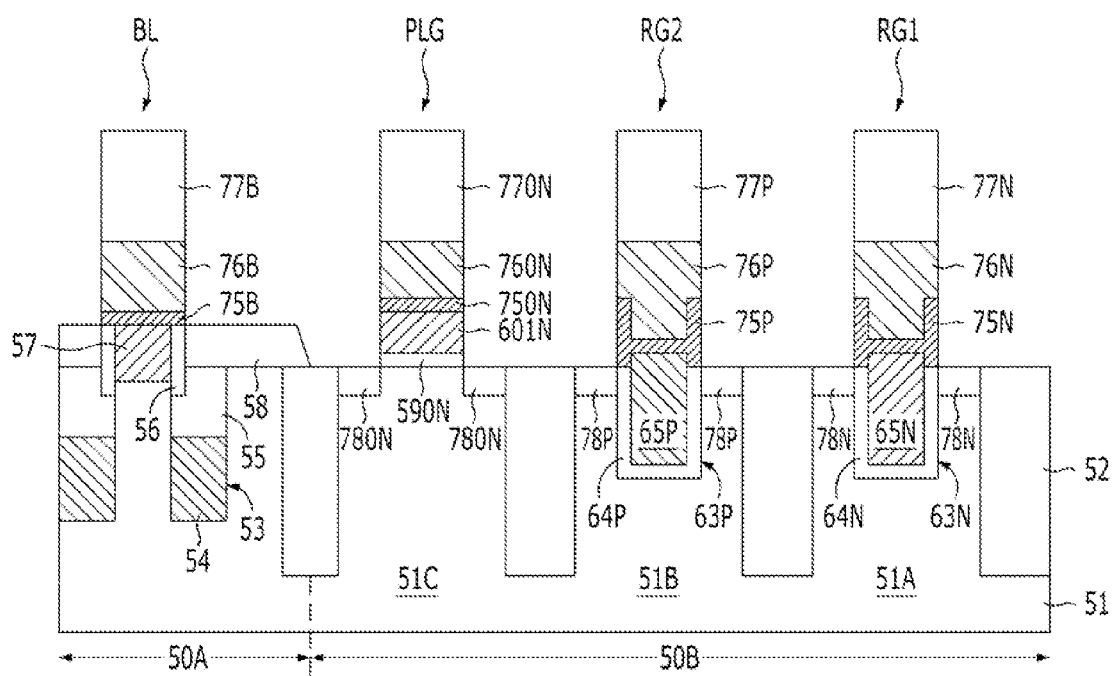

Referring to FIG. 5K, a bit line structure BL and gate structures PLG, RG1, and RG2 are formed. The bit line structure BL and the gate structures PLG, RG1, and RG2 may be formed at the same time. The bit line structure BL may be formed in the cell region 50A. The gate structures PLG, RG1, and RG2 may be formed in the peripheral circuit region 50B. The first and second recess gate structures RG1 and RG2 are formed in the first and second regions 51A and 51B, respectively. The planar gate structure PLG is formed in the third region 51G. For example, the gate hard mask layer 77, the metal-containing layer 76, the barrier 75, and the doped conductive layer patterns 60N and 60P are sequentially etched. For this operation, a gate mask (not illustrated) may be used. When the first and second recess gate structures RG1 and RG2 are formed, both of the doped conductive layer patterns 60N and 60P may be removed. However, when the planar gate structure PLG is formed, the doped conductive layer pattern 600N may be etched to form a third doped gate electrode 601N.

The first recess gate structure RG1 has a stacked structure including the first doped gate electrode 65N. The second recess gate structure RG2 has a stacked structure including the second doped gate electrode 65P. The planar gate structure PLG may include the third doped gate electrode 601N.

The first recess gate structure RG1 may include the first doped gate electrode 65N, a first barrier layer 75N, a first metal-containing electrode 76N, and a first gate hard mask layer 77N. The second recess gate structure RG2 may include the second doped gate electrode 65P, a second barrier layer 75P, a second metal-containing electrode 76P, and a second gate hard mask layer 77P. The planar gate structure PLG may include the third doped gate electrode 601N, a third barrier layer 750N, a third metal-containing electrode 760N, and a third gate hard mask layer 770N.

The first to third barrier layers 75N, 75P, and 750N are formed of the same material. The first to third metal-containing electrodes 76N, 76P, and 760N are formed of the same material. The first to third gate hard mask layers 77N 77P, and 770N are formed of the same material. The first and second doped gate electrodes 65N and 65P are recessed and formed in the first and second trenches 63N and 63P, respectively. However, the third doped gate electrode 601N may be formed over the substrate 51. Furthermore, the first and second gate dielectric layers 64N and 64P may be formed on the surfaces of the first and second trenches 63N and 63P, respectively. Between the third doped gate electrode 601N and the substrate 51, a third gate dielectric layer 590N may be formed. The third gate dielectric layer 590N may be formed by etching the gate dielectric layer pattern 59A. In the first and second regions 51A and 51B, the gate dielectric layer pattern 59A is removed.

The bit line structure BL may be formed in the cell region 50A. The bit line structure BL may have a stacked structure including a fourth barrier layer 75B, a bit line 75N, and a bit line hard mask layer 77B. The fourth barrier layer 75B, the bit line 76B, and the bit line hard mask layer 77B may be formed by etching the barrier layer 75, the metal layer 76, and the gate hard mask layer 77. As such, the gate structures may be formed in the peripheral circuit region 50B at the same time when the bit line structure BL is formed in the cell region 50A.

Subsequently, although not illustrated, a gate spacer process may be performed after the gate etching process. The gate spacer may be formed of silicon oxide, silicon nitride or the like.

Then, first source/drain regions 78N, second source/drain regions 78P, and third source/drain regions 780N are formed. In order to form the source/drain regions, source/drain ion implant processes (not illustrated) may be performed. Subsequently, anneal is performed. The anneal may include rapid thermal anneal. The anneal is performed to activate impurities implanted in the first source/drain regions 78N, the second source/drain regions 78P, and the third source/drain regions 780N. In this embodiment of the present invention, an N-type dopant may be implanted into the first source/drain regions 78N and the third source/drain regions 780N, and a P-type dopant may be implanted into the second source/drain regions 78P.

The semiconductor devices in accordance with the first and second embodiments of the present invention may be applied to a saddle fin transistor. Furthermore, the semiconductor devices may include an NMOSFET and a PMOSFET forming a sense amplifier.

Figure 6:
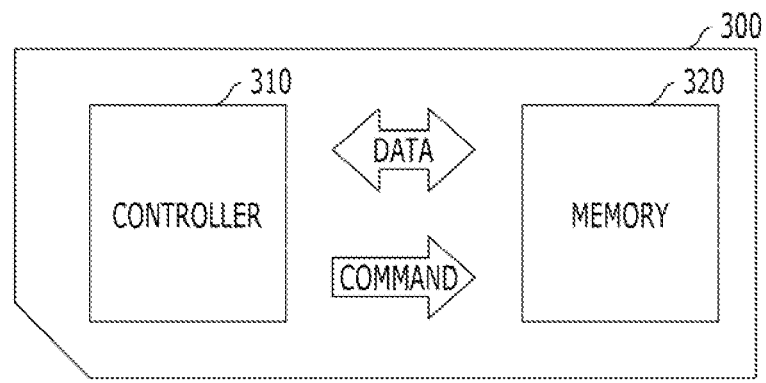
FIG. 6 is a schematic view of a memory card.

FIG. 6 is a schematic view of a memory card. Referring to FIG. 6, the memory card 300 may include a controller 310 and a memory 320. The controller 310 and the memory 320 may exchange electrical signals. For example, the memory 320 and the controller 310 may exchange data according to a command of the controller 310. Accordingly, the memory card 300 may store data in the memory 320, or output data from the memory 320 to the outside. The memory 320 may include the above-described CMOS device in a specific part thereof. The memory card 300 may be used as data storage media of various portable devices. For example, the memory card 300 may include a memory stick card, a smart media card (SM), a secure digital card (SD), a mini secure digital card (mini SD), or a multi-media card (MMC).

Figure 7:
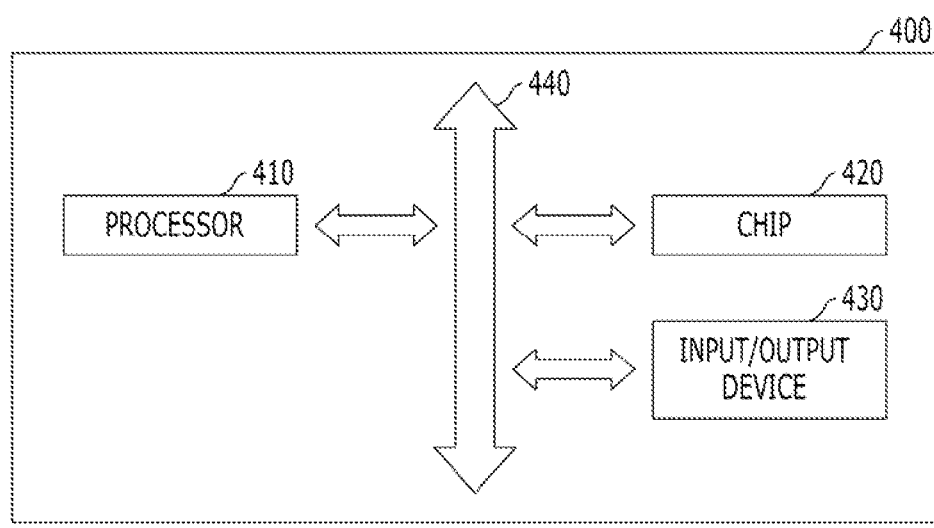
FIG. 7 is a block diagram illustrating an electronic system.

FIG. 7 is a block diagram illustrating an electronic system. Referring to FIG. 7, the electronic system 400 may include a processor 410, an input/output device 430, and a chip 420, which perform data communication through a bus 440. The processor 410 serves to perform a program operation and control the electronic system 400. The input/output device 430 may be used to input or output data of the electronic system 400. The electronic system 400 may be connected to an external device, for example, a personal computer or network, and exchange data with the external device through the input/output device 430. The chip 420 may store codes and data for the operation of the processor 410, and may process a part of operations assigned by the processor 410. For example, the chip 420 may include the above-described CMOS device. The electronic system 400 may form various electronic control devices requiring the chip 420. For example, the electronic system 400 may be applied to a mobile phone, an MP3 player, a navigation system, a solid state disk (SSD), and household appliances.

In accordance with the embodiments of the present invention, since the polysilicon is used as a buffer layer to dope the recessed gate electrode, the dopant may be implanted without damaging the areas where the source/drain regions are to be formed.

Furthermore, when the dopant is implanted, the dopant may be sufficiently implanted into a deep region of the recessed gate electrode, even though the ion implant target is set to the planar gate structure.

Accordingly, since the recessed gate electrode and the planar gate electrode may be doped at the same time, it may be possible to form the doped gate electrodes with the same quality.

Although various embodiments have been described for illustrative purposes, it will be apparent to those skilled in the art that various changes and modifications may be made without departing from the spirit and scope of the invention as defined in the following claims.

What is claimed is:

1. A method for fabricating a semiconductor device, comprising:
    forming a conductive layer over first and second regions of a semiconductor substrate;
    forming a trench extended in the first region of the semiconductor substrate through the conductive layer;
    forming a first gate electrode in the trench;
    doping the conductive layer over the first and second regions and the first gate electrode;
    forming a second gate electrode in the second region by etching the doped conductive layer;
    forming a metal containing layer over the first and second gate electrodes; and
    etching the metal-containing layer to form metal-containing electrodes over the first and second gate electrodes, respectively,
    wherein the doping of the first gate electrode and the conductive layer comprises:
        doping an N-type dopant into the conductive layer of the second region using a first mask pattern to cover the first region and to open the second region;
        doping a P-type dopant into the first gate electrode using a second mask pattern to cover the second region and to open the first region; and
    performing anneal to active the N-type dopant and the P-type dopant.

2. The method of claim 1, wherein the doping of the conductive layer and the first gate electrode comprises:
    forming a mask pattern to open the first gate electrode and the conductive layer at the same time;
    injecting a dopant into the conductive layer and the first gate electrode; and
    performing anneal to active the dopant.

3. The method of claim 1, wherein the forming of the first gate electrode comprises:
    forming a polysilicon layer over the conductive layer so as to gap-fill the trench; and
    selectively removing the polysilicon layer to be buried in the trench.

4. The method of claim 3, wherein the selectively removing of the polysilicon layer comprises etching back the polysilicon layer such that the polysilicon layer is left to a level corresponding to an interface between the conductive layer and the semiconductor substrate.

5. The method of claim 1, wherein the conductive layer and the first gate electrode comprise polysilicon.

6. The method of claim 1, wherein the doping of the N-type dopant comprises implant, and the doping of the P-type dopant comprises plasma doping.

7. A method for fabricating a semiconductor device, comprising:
    forming a conductive layer over first, second and third regions of a semiconductor substrate;
    forming first and second trenches extended in the first and second regions of the semiconductor substrate, respectively, through the conductive layer;
    forming first and second gate electrodes in the first and second trenches, respectively;
    doping a first dopant into the conductive layer over the third region and the first gate electrode;
    doping a second dopant into the second gate electrode, wherein the second dopant is different from the first dopant;
    performing anneal to activate the first and second dopants; and
    forming a gate electrode over the third region by etching the doped conductive layer.

8. The method of claim 7, wherein the doping of the first dopant comprises:
    forming a mask pattern to cover the second gate electrode and to open the first gate electrode and the conductive layer at the same time; and
    injecting an N-type dopant into the first gate electrode and the conductive layer.

9. The method of claim 8, wherein the doping of the second dopant comprises:

forming a mask pattern to open the second gate electrode and to cover the first gate electrode and the conductive layer; and injecting a P-type dopant into the second gate electrode.

10. The method of claim 7, wherein the forming of the first and second gate electrodes comprises:

forming a polysilicon layer over the conductive layer so as to gap-fill the first and second trenches; and etching back the polysilicon layer such that the polysilicon layer is left to a level corresponding to an interface between the conductive layer and the semiconductor substrate.

11. The method of claim 7, further comprising, after the performing of the anneal:

forming a metal-containing layer over the first and second gate electrodes and the conductive layer; and etching the metal-containing layer to form metal-containing electrodes over the first and second gate electrodes and the conductive layer, respectively.

12. The method of claim 7, wherein the conductive layer and the first and second gate electrodes comprise polysilicon.

13. A method for fabricating a semiconductor device, comprising:

forming a conductive layer over first and second regions of a semiconductor substrate;

forming a trench extended in the first region of the semiconductor substrate through the conductive layer;

forming a gate dielectric layer along an innerwall of the trench;

forming a first gate electrode in the trench where the gate dielectric layer is formed;

recessing the gate dielectric layer to a lower level than that of the surface of the first gate electrode;

doping the conductive layer over the first and second regions and the first gate electrode;

forming a metal-containing layer including a barrier layer on the entire surface of the resulting structure including the first gate electrode, the recessed gate dielectric layer and the doped conductive layer;

forming metal-containing electrodes in the first and second regions by etching the metal-containing layer; and forming a second gate electrode over the second region by etching the doped conductive layer in the second region.

14. A method for fabricating a semiconductor device, comprising:

forming a conductive layer over first, second and third regions of a semiconductor substrate;

forming a trench extended in the first region of the semiconductor substrate through the conductive layer;

forming a first gate electrode in the trench;

doping the conductive layer over the first, second and third regions and the first gate electrode;

selectively removing the doped conductive layer in the third region;

forming a metal-containing layer on the entire surface of the resulting structure including the remaining doped conductive layer;

forming metal-containing electrodes in the first and second regions and forming a bit line in the third region, by etching the metal-containing layer; and forming a second gate electrode over the second region by etching the doped conductive layer in the second region.

15. A method for fabricating a semiconductor device, comprising:

forming a conductive layer over first, second and third regions of a semiconductor substrate;

forming a trench extended in the first region of the semiconductor substrate through the conductive layer;

forming a gate dielectric layer on the surface of the trench;

forming a first gate electrode in the trench where the gate dielectric layer is formed;

recessing the gate dielectric layer to a lower level than that of the surface of the first gate electrode;

doping the conductive layer and the first gate electrode with a dopant;

selectively removing the doped conductive layer in the third region;

forming a metal-containing layer including a barrier layer on the entire surface of the resulting structure including the remaining doped conductive layer;

forming metal-containing electrodes in the first and second regions and forming a bit line in the third region, by etching the metal-containing layer; and forming a second gate electrode over the second region by etching the doped conductive layer in the second region.

16. The method of claim 15, wherein the conductive layer and the first and second gate electrodes comprise polysilicon.

17. The method of claim 15, wherein the first gate electrode comprises P-type doped polysilicon, and the second gate electrode comprises N-type doped polysilicon.

18. The method of claim 15, wherein the forming of the metal-containing electrodes comprises etching the barrier layer so as to cap the top surfaces of the first gate electrode and the recessed gate dielectric layer.

* * * * *